United States Patent
Nakaide et al.

[11] Patent Number: 5,812,559
[45] Date of Patent: Sep. 22, 1998

[54] CONTROLLING METHOD AND APPARATUS FOR EXAMINATION OF MULTIPORT RAM (S)

[75] Inventors: Hiroshi Nakaide; Fumihiko Saito; Shinzi Hiyama; Koji Ikuta, all of Kawasaki, Japan

[73] Assignee: Fujitsu Limited, Kawasaki, Japan

[21] Appl. No.: 949,705

[22] Filed: Sep. 23, 1992

[30] Foreign Application Priority Data

Oct. 2, 1991 [JP] Japan .................................. 3-255126

[51] Int. Cl.⁶ ..................................................... G11C 29/00
[52] U.S. Cl. .................. 371/21.2; 365/201; 365/230.05; 711/211
[58] Field of Search ..................................... 395/400, 425, 395/575, 250, 275; 364/200 MS File, 900 MS File, DIG. 1, DIG. 2; 371/21.1, 21.2; 365/201, 230.05, 189.05; 711/211

[56] References Cited

FOREIGN PATENT DOCUMENTS

| 0439189 | 7/1991 | European Pat. Off. . | |
|---|---|---|---|
| 5494995 | 6/1982 | Japan ..................................... | 371/21.2 |
| 61-280099 | 12/1986 | Japan . | |
| 63-103984 | 5/1988 | Japan . | |
| 2123590 | 5/1990 | Japan ................................. | 365/230.05 |
| 4155691 | 5/1992 | Japan ................................. | 365/230.05 |

*Primary Examiner*—Jack A. Lane
*Attorney, Agent, or Firm*—Greer, Burns & Crain, Ltd.

[57] ABSTRACT

A control method and apparatus for the examination of multiport RAM(s) connected between a CPU on a CPU side and a hardware circuit on a hardware circuit side. The method and apparatus are for use in a device comprising a single RAM or more. For instance, the device may have a first RAM and a second RAM having ports on CPU and a hardware circuit side of the RAMs. Each one port on the CPU side is connected to a CPU. The method and apparatus examine the ports on the hardware circuit as well as the CPU side ports. The method may comprise steps of reading data stored in the first RAM from a port on the hardware circuit of the first RAM and writing the data in the second RAM from the port on the hardware circuit side of the second RAM using a RAM examination controller. The data read from the one port of the first RAM on the CPU side of the RAMs is compared with the data from the other port of the second RAM on the CPU side of the RAMs. The operation of ports of the first RAM and the second RAM on the hardware circuit side of the RAMs is examined.

6 Claims, 5 Drawing Sheets

CONTROLLING METHOD AND APPARATUS FOR EXAMINATION OF MULTIPORT RAM(S)

BACKGROUND OF THE INVENTION

1. Field of the Invention

The present invention relates to a controlling method and apparatus for the examination of multiport RAM(s) (Random-access Memory) wherein ports of the multiport RAMS(s) are examined to determine whether or not the multiport RAM(s) are accessed correctly.

2. Description of the Related Art

By the recent development of high technology of an apparatus, a central processing unit (CPU) must be provided in the apparatus. Further, larger apparatuses require high speed collection of various data. As a result, it is necessary that the collection of data information be executed by using a hardware circuit (simple operating apparatus not using programming) and processing be executed by the CPU.

Accordingly, a multiport RAM or multiport RAMs are used for an interface between the hardware and the CPU. In this case, the correct operation of each port of the multiport RAM is necessary.

In a conventional apparatus using a multiport RAM examination control method, a first RAM and a second RAM having multiports are provided between a hardware circuit and a CPU. The hardware circuit carries out high speed data collection and transmission between the hardware circuit and another hardware circuit or the CPU.

The CPU processes data information from the hardware circuit and sends the processed results to the hardware circuit. The first RAM and the second RAM are read only and write only memories, respectively, and have a buffer function by which the data information is received or sent between the hardware circuit and the CPU.

The CPU accesses the first RAM and the second RAM through an address bus, writes the data in the first RAM, and reads the data from the second RAM. The hardware circuit accesses the first RAM and the second RAM through two other address buses, writes the data in the second RAM, and reads the data from the first RAM.

Ports of the first and second RAMs on the side of the CPU can be examined to determine whether or not it is correct by the CPU itself. Ports on the side of the hardware circuit, however, cannot be examined by the CPU.

As mentioned above, in the conventional apparatus, the examination of the multiport RAM can only be performed for the ports connected to the CPU. As a result, the ports connected to the hardware circuit cannot be examined to assure a correct operation.

Accordingly, because of not assuring whether or not the data processed, including data in the hardware circuit, by the CPU are correct, there is the possibility that the processed result has a system fault.

SUMMARY OF THE INVENTION

An object of the present invention is to be able to examine whether or not ports of multiport RAMs on the side of a hardware circuit operate correctly.

In a first aspect of the invention, there is provided a controlling method for the examination of multiport RAMs, connected to a CPU by one port, respectively, having a first RAM read only from a hardware circuit and a second RAM written only from the hardware circuit, and other ports on the side of the hardware circuit are examined to determine whether or not the other ports operate correctly, comprising the steps of reading data stored in the first RAM from the other port of the first RAM using a RAM examination controller, writing the data in the second RAM through the other port of the second RAM using a RAM examination controller, reading and comparing the data from the one port of the first RAM and the data from the one port of the second RAM by using the CPU, whereby operations of the other ports of the first RAM and the second RAM are examined to determine whether or not the operations are correct.

In a second aspect of the invention, there is provided a controlling method for the examination of a multiport RAM, connected to a CPU by one port, and another port of which on the side of the hardware circuit is examined to determine whether or not the port operates correctly, comprising the steps of reading data stored in the RAM from the other port of the RAM, using a RAM examination controller, rewriting the data in the RAM from the other port of the RAM, using a RAM examination controller, reading and comparing the data stored in the RAM from the one port of the RAM to the rewritten data, by using the CPU, whereby operation of the other port of the RAM is examined to determine whether or not the operation is correct.

In a third aspect of the invention, there is provided a controlling apparatus for the examination of multiport RAMs having a CPU, a first RAM and a second RAM for reading and writing data to or from the CPU through one port of each of the RAMs, and a hardware circuit connected to each of the RAMs through another port, and further comprising a RAM examination controller between the hardware circuit and the respective other ports of the first RAM and the second RAM. The RAM examination controller reads data from the other port of the first RAM, and writes the data in the second RAM through the other port. The CPU reads and compares the data from the one port of the first RAM and the data from the one port of the second RAM. Thus, an operation of the other ports of the first RAM and the second RAM is examined to determine whether or not it is correct.

In a fourth aspect of the invention, there is provided a controlling apparatus for the examination of a multiport RAM having a CPU, a RAM for reading and writing data to or from the CPU through one port, a hardware circuit, and further a RAM examination controller between the hardware circuit and another port of the RAM. The RAM examination controller reads data from the other port of the RAM and rewrites the data to the RAM through the other port of the RAM. The CPU reads and compares the data stored in the RAM from the one port of the RAM to the rewritten data. Thus, an operation of the other port of the RAM is examined to determine whether or not it is correct.

Other features and advantages of the invention will be apparent from the following description with reference to the accompanying drawings.

DESCRIPTION OF THE PREFERRED EMBODIMENTS

Prior to an explanation of embodiments of the invention, the conventional art is explained with reference to FIG. 1.

Figure 1:
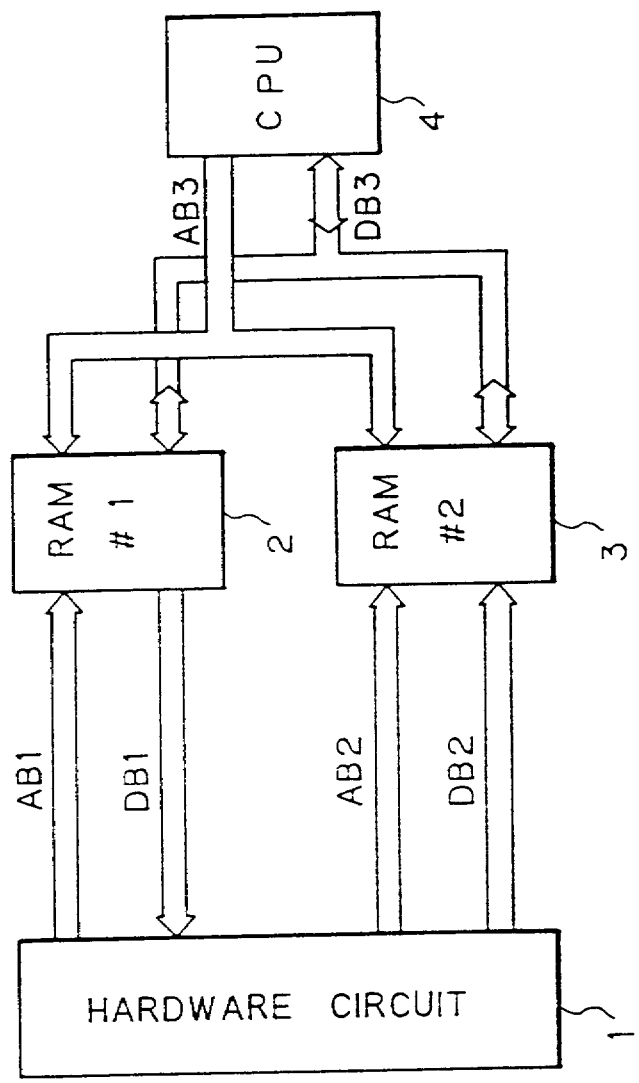
FIG. 1 is a block diagram showing an apparatus executing a controlling method for the examination of multiport RAMs as a prior art.

FIG. 1 shows an example of an apparatus using a conventional controlling method. A first RAM (#1)2 and a second RAM (#2)3 (having multiple ports) are located between a hardware circuit 1 and a CPU 4. The hardware circuit 1 collects the data information and sends the same at a high speed from or to another hardware circuit (not shown) or the CPU.

The CPU 4 processes data information sent from the hardware circuit 1, and sends the processed results to the hardware circuit 1. The RAM 2 and the RAM 3 have read only and write only memories, respectively, and have a give-and-take function for the data information between the hardware circuit 1 and the CPU 4.

The CPU 4 accesses the RAM 2 and the RAM 3 through an address bus AB3, writes the data in the RAM 2, and reads the data from the RAM 3. The hardware circuit 1 accesses the RAM 2 and the RAM 3 through the address buses AB1 and AB2, writes the data in the RAM 3 and reads the data from the RAM 2.

Ports of the RAM 2 and the RAM 3 on a side connected to the CPU 4 can be examined by the CPU itself to determine whether or not the operation is correct. The ports connected to the side of the hardware circuit 1, however, cannot be examined by using the CPU 4.

Next, an apparatus carrying out a controlling method for the examination of multiport RAMs according to a first embodiment of the invention is explained with reference to FIG. 2.

Figure 2:
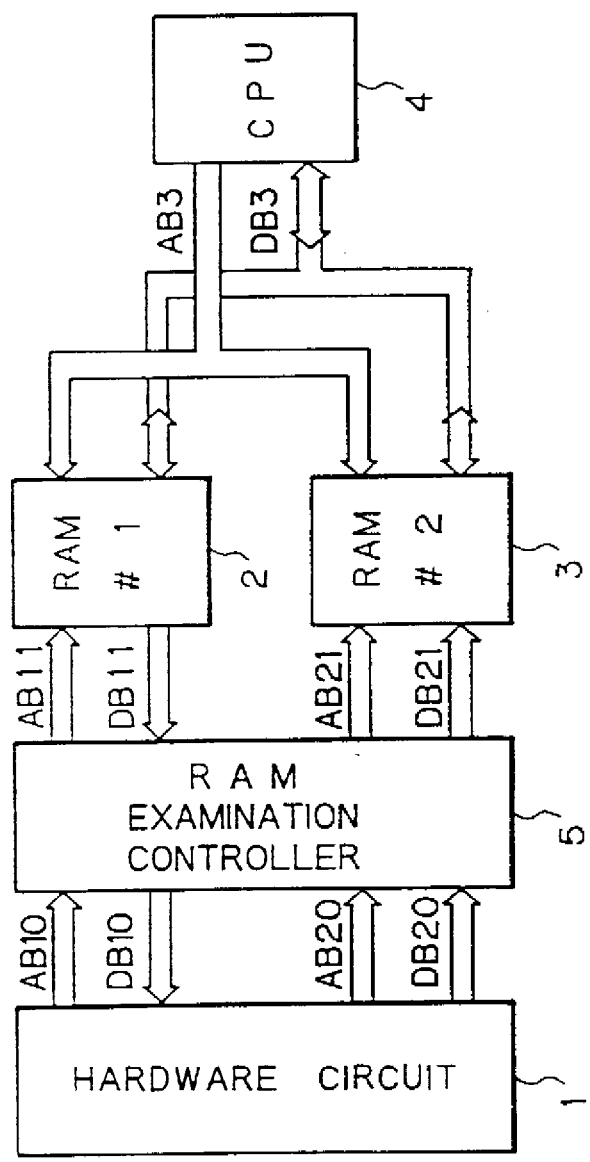
FIG. 2 is a schematic block diagram showing a first embodiment according to the present invention.

In FIG. 2, one port of a first RAM 2 is a read only port and one port of a second RAM 3 is a write only port. These are the ports on the side at the RAMs connected to the CPU 4 via an address bus AB3 and a data bus DB3.

Another port of the first RAM 2; namely, a port on the side of a hardware circuit 1 is connected to a RAM examination controller 5 by an address bus AB11 and a data bus DB11.

Another port of the second RAM 3 is connected to the RAM examination controller 5 by an address bus AB21 and a data bus DB21.

The RAM examination controller 5 is connected to the hardware circuit 1 by an address bus AB10, a data bus DB10, an address bus AB20, and a data bus DB20.

The RAM examination controller 5 reads data stored in the first RAM 2 from the other port, and writes the data in the second RAM 3 through the other port of the second RAM 3.

Then, the CPU 4 reads the data from the one port of the first RAM 2 and one port of the second RAM 3 and compares the data, and the operation of the one port of the first RAM 2 and the one port of the second RAM 3 is examined to determine whether or not it is correct.

Next, the RAM examination controller 5 according to the first embodiment is explained with reference to FIG. 4.

The RAM examination controller 5 has an address counter 55 therein, and creates an address signal. An address selector (#1)53 selects an address signal supplied from the hardware circuit 1 through an address bus AB10 or an internal address signal from the address counter 55, and supplies the selected signal to the RAM 2 through a bus AB11. An address selector (#2)54 selects an address signal supplied from the hardware circuit 1 through an address bus AB20 or an internal address signal from the address counter 55, and supplies the selected signal to the RAM 3 through a bus AB21.

The RAM examination controller 5 has further data buffers (#1)50, (#2)51, and (#3)52. In a usual operation; namely, when the RAM 2 and the RAM 3 are accessed by the address signal from the hardware circuit 1, the address selectors 53 and 54 operate to supply the address signal from the hardware circuit 1 to the RAM 2 and the RAM 3 through the address buses AB10 and AB20.

Simultaneously, a data buffer 50 and a data buffer 52 become an enable (ON) state and a data buffer 51 becomes a disable (OFF) state. Then, the RAM 2 is accessed in accordance with the address signal from the hardware circuit 1, reads the data stored in the corresponding address, and the read data are supplied to the hardware circuit 1 through the data buffer 50.

On the other hand, the data from the hardware circuit 1 are stored in the corresponding address in the RAM 3 in accordance with the address signal from the hardware circuit 1 through the data buffer 52.

When the operation of the ports that are the other port of the RAM 2 and the other port of the RAM 3; namely, the ports connected to the address bus AB11, the address bus AB21, a data bus DB11, and a data bus DB21, are examined, the address selectors 53 and 54 are selected so that the RAM 2 and the RAM 3 are accessed in accordance with the address signal from the address counter 55.

Namely, the address selector 53 and the address selector 54 are selected by a control signal supplied through a control bus (not shown) from the CPU 4 (not shown in FIG. 4), and the address signal from the address counter 55 is supplied to the address buses AB11 and AB21.

Similarly, when the CPU 4 examines the RAMs, the data buffer 52 is in a disable (OFF) state and the data buffer 50 and the data buffer 51 are in an enable (ON) state.

Accordingly, the data stored in the corresponding address in the RAM 2 are read in accordance with the internal address signal supplied to the address bus AB11 from the address counter 55, and are guided to the data buffer 51.

Then, the data that are read from the RAM 2 and guided to the data buffer 51, are stored in the corresponding address in the RAM 3 in accordance with the internal address signal supplied to the address bus AB21 from the address counter 55.

Further, the CPU 4 after selecting address selectors 53 and 54, reads two data stored in the address that is specified by the address signal from the address counter 55, in the RAM 2 and the RAM 3 and compares the two data. The data from the RAM 3 are stored after reading from the RAM 2. Therefore, the two data are generally identical.

If the two data read by the CPU 4 coincide with each other, the operation of the other ports that are different from the port connected to the CPU in the RAM 2 and the RAM 3; namely, the port on the side of the hardware circuit 1 can be assured to be correct. If the two data do not coincide with each other, it is determined that the operation of the other ports is not correct. As mentioned above, by using this embodiment, the correct operation regarding the other ports of the RAM 2 and the RAM 3 can be determined by the CPU 4.

An apparatus executing a controlling method for the examination of a multiport RAM according to a second embodiment of the invention is explained with reference to FIG. 3.

Figure 3:
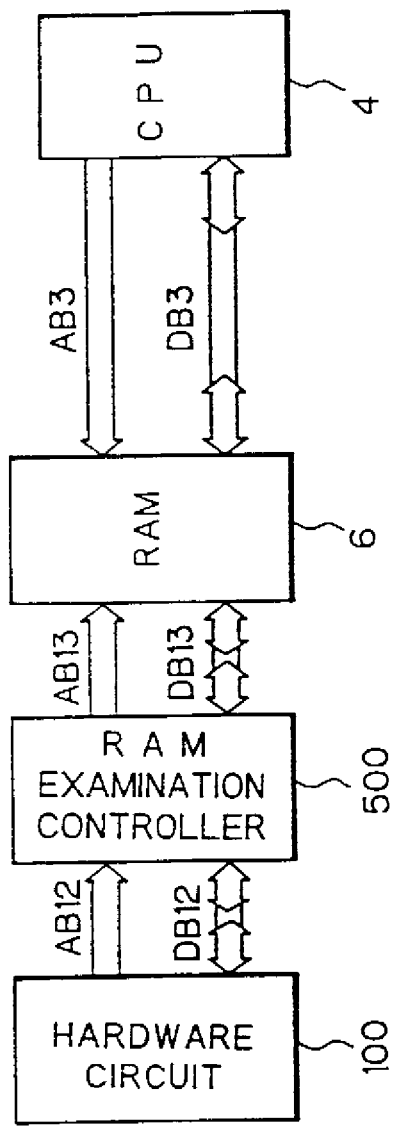
FIG. 3 is a schematic block diagram showing a second embodiment according to the invention.

In FIG. 3, a CPU 4 is connected to one port of a RAM 6 through an address bus AB3 and a data bus DB3. Another port of the RAM 6 is connected to a RAM examination controller 500 through an address bus AB13 and a data bus DB13.

The RAM examination controller 500 is connected to a hardware circuit 100 through an address bus AB12 and a data bus DB12. The RAM examination controller 500 reads data stored in the RAM 6 from the other port, and rewrites the read data in the RAM 6.

Then, the CPU 4 reads the data stored in the RAM 6 through the one port of the RAM 6 and the rewritten data, compares the two data, and the operation of the other port of the RAM 6 is examined.

The RAM examination controller 500 according to the second embodiment is explained with reference to FIG. 5.

The RAM examination controller 500 has an address counter 515 and generates an internal address signal. An address selector 513 selects an address signal from the hardware circuit 100 or an address signal from the address counter 515.

The RAM examination controller 500 has further data buffers (#1)510, (#2)511, (#3)512, and a data latch circuit 56. In the usual operation, the address selector 513 selects a signal so that the signal from the hardware circuit 100 is connected to the RAM 6.

When reading the RAM 6, the data buffer 510 is in an enable (ON) state, and the data buffers 511 and 512 are in a disable (OFF) state. The data stored in the corresponding address in the RAM 6 to the address signal is read and transferred to the hardware circuit 100 through the data bus DB13, the data buffer 510, the data bus DB12.

When the data are written, the data buffer 510 and the data buffer 511 are in a disable (OFF) state and the data buffer 512 is in an enable (ON) state. The data from the hardware circuit 100 are transferred to the RAM 6, and written in the address corresponding to the address signal.

Since the read and write operations for the RAM 6 in the above usual operation are controlled by the hardware circuit 100, the operations are completely the same as in the conventional apparatus.

On the other hand, the operation examining the correct operation of the port of the RAM 6 connected to the hardware circuit 100 according to the invention is as follows. As shown in FIG. 4, the CPU 4 controls the address selector 513 so that the address signal from the address counter 515 in the RAM examination controller 500 is connected to the RAM 6.

Then, when the data are read from the RAM 6, the data buffer 511 and the data buffer 510 are in a disable (OFF) state and the read data are held by the data latch circuit 56.

When writing, the data buffer 511 is in an enable (ON) state and the data buffer 512 is in a disable (OFF) state. The data held by the data latch circuit 56 are transferred to the RAM 6, and stored in the address corresponding to the address signal from the address counter 515.

Accordingly, the data read at once from the port connected to the hardware circuit 100, are rewritten in the RAM 6. The CPU 4 compares the data stored in the RAM 6 with the data rewritten via the data latch circuit 56, and if the two data coincide with each other, correct operation of the port can be assured.

Figure 5:
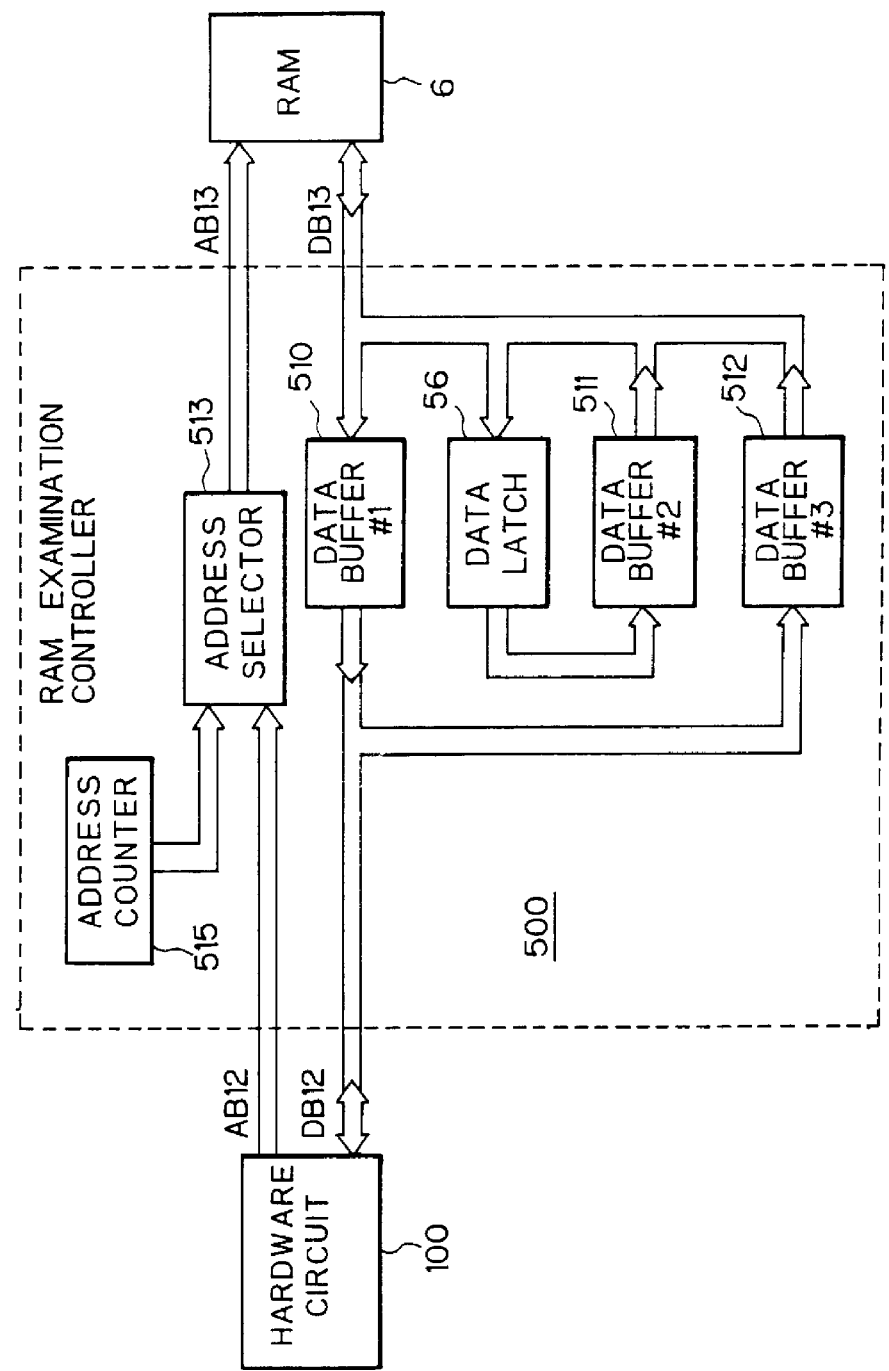
FIG. 5 is a detailed block circuit diagram showing the RAM examination controller of FIG. 3.

As mentioned above, by using the second embodiment shown in FIG. 3 and FIG. 5, the CPU 4 can examine the operation of the port connected to the hardware circuit 100 in the RAM.

In the above embodiments, the RAM examination controller 5 or 500 are provided between the hardware circuit 1 and the RAMs 2 and 3, or the hardware circuit 100 and RAM 6, respectively. Thus, in FIG. 2, the data stored in RAM 2 is read and the data is written in the RAM 3. In FIG. 3, the data stored in the RAM 6 is read and the data is rewritten in the RAM 6.

The CPU 4 reads the stored data and the written data through one port(s) and compares the two data. The two data are generally identical. Accordingly, if identity is assured by the CPU, it is determined that the read operation through the other port of the RAM 2, the write operation through the other port of the RAM 3, and the read and write operations through the other port of the RAM 6 are correct.

Figure 4:
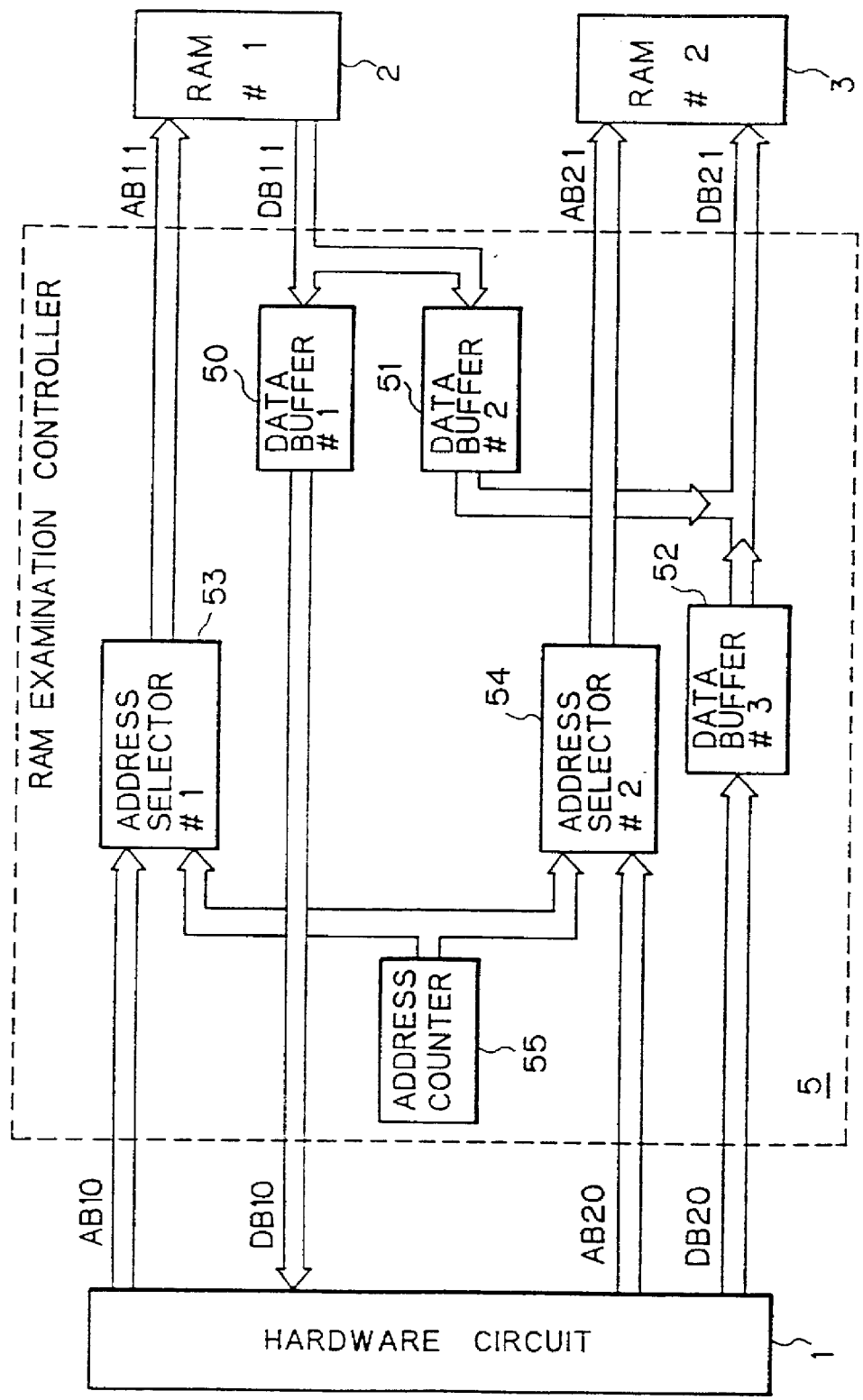
FIG. 4 is a detailed block circuit diagram showing the RAM examination controller of FIG. 2.

In the above embodiments of FIG. 4 and FIG. 5, two port RAMs are used. However, this invention is not limited to the above case. The number of RAMs and the number of ports of the RAM can be modified in accordance with the technical spirit of this invention. By using this invention, the operation of all of the ports of the multiport RAM can be examined by only adding a simple circuit consisting of hardware. Whereby, system failure by an abnormality of the RAM port can be avoided. As a result, the reliability of the whole system increases.

We claim:

1. A controlling method for the examination of multiport RAMs having a CPU side and a hardware circuit side, the multiport RAMs being connected on the CPU side of the RAMs to a CPU, and being connected on the hardware circuit side of the RAMs to a RAM examination controller which is connected to a hardware circuit, where the CPU is capable of performing a plurality of functions in an arbitrary order requested by the user and can execute various commands and processes, the hardware circuit can perform only a limited number of functions in a predetermined order, the RAM examination controller including an address selector for selectively reading an address signal from the hardware circuit during normal operation, and reading an address signal from an internal address counter during examination of the RAM, the RAMs including a first RAM that is read only from the hardware circuit and a second RAM that is written only from the hardware circuit, the first and second RAMs each having ports on the hardware circuit side of the RAMs and ports on the CPU side of the RAMs, the ports on the hardware circuit side of the RAMs being examined to determine whether or not the ports operate correctly, comprising the steps of:

selecting an address signal from the internal address counter of the RAM examination controller:

reading data stored in an address of the first RAM corresponding to said selected address signal from a first port on the hardware circuit side of the first RAM using the RAM examination controller;

writing the data in an address of the second RAM corresponding to said selected address signal through a first port of the second RAM on the hardware circuit side of the second RAM using the RAM examination controller; and reading and comparing the data from a second port of the first RAM on the CPU side of the RAM and the data from a second port of the second RAM by using the CPU to determine if operations of the ports on the hardware circuit side of the first RAM and the second RAM are correct.

2. A controlling method for the examination of a multiport RAM having a CPU side and a hardware circuit side, the multiport RAM being connected to a CPU through ports on the CPU side and a RAM examination controller through ports on the hardware circuit side which is connected to a hardware circuit, to determine whether the port on the hardware circuit side of the RAM operates correctly, where the CPU is capable of performing a plurality of functions in an arbitrary order requested by the user and can execute various commands and processes, the hardware circuit can perform only a limited number of functions in a predetermined order, and the RAM examination controller includes an address selector for selectively reading an address signal from the hardware circuit during normal operation and reading an address signal from an internal address counter during examination of the RAM, said method comprising the steps of:

selecting an address signal from the internal address counter of the RAM examination controller:

reading data stored in an address of the RAM corresponding to said selected address signal from the port on the hardware circuit side of the RAM, using the RAM examination controller;

rewriting the data in an address of the RAM corresponding to said selected address signal from the port on the hardware circuit side of the RAM, using the RAM examination controller; and reading and comparing, from the port on the CPU side of the RAM, data stored in the RAM and the rewritten data to determine if the operation of the port on the hardware circuit side of the RAM is correct.

3. A controlling apparatus for the examination of multiport RAMs in a device having a CPU, the RAMs having a CPU side and a hardware circuit side, the RAMs including a first RAM and a second RAM for reading and writing data, respectively, to or from the CPU, the first and second RAMs being directly connected solely to the CPU through ports on the CPU side, and being connected solely to a hardware circuit through ports on the hardware circuit side of the RAMs, where the CPU is capable of performing a plurality of functions in an arbitrary order requested by the user and can execute various commands and processes, and the hardware circuit can perform only a limited number of functions in a predetermined order, the apparatus comprising:

a RAM examination controller directly connected between the hardware circuit and the ports on the hardware circuit side of the first and the second RAMs, said RAM examination controller including an address selector for selectively reading an address signals from the hardware circuit during normal operation and reading an address signal from an internal address counter during examination of the RAM;

said RAM examination controller reading data from an address in the first RAM corresponding to said selected address signal, through a first port of the first RAM on the hardware circuit side of the RAMs, and writing the data to an address in the second RAM corresponding to said selected address signal through a second port of the second RAM on the hardware circuit side of the RAMs; and reading and comparison means, in the CPU, for reading and comparing data from a first port of the first RAM on the CPU side of the RAMs and data from a second port of the second RAM on the CPU side of the RAMs, to determine if operation of the ports on the hardware circuit side of the first and second RAMs is correct.

4. A controlling apparatus for the examination of multiport RAMs as set forth in claim 3, wherein said RAM examination controller comprises:

an address counter for setting an address for the first RAM and the second RAM, and a data buffer circuit for writing the data in the second RAM through the port of the second RAM on the hardware circuit side of the RAMs after data is read from the port of the first RAM on the hardware circuit side of the RAMs.

5. A controlling apparatus for the examination of a multiport RAM used for reading and writing data in a device having a CPU, the RAM having a CPU side and a hardware circuit side, and being directly connected to the CPU on the CPU side of the RAM, and being connected to a hardware circuit on the hardware circuit side of the RAM, where the CPU is capable of performing a plurality of functions in an arbitrary order requested by the user and can execute various commands and processes, and the hardware circuit can perform only a limited number of functions in a predetermined order, said controlling apparatus comprising:

a RAM examination controller connected directly between the hardware circuit and a port of the RAM on a hardware circuit side of the RAM, said RAM examination controller including an address selector for selectively reading an address signal from the hardware circuit during normal operation and reading an address from an internal address counter during examination of the RAM;

said RAM examination controller reading data from an address in the RAM corresponding to said selected address signal, through the port of the RAM on the hardware circuit side of the RAM and rewriting the data to an address in the RAM corresponding to said selected address signal, through the port of the RAM on the hardware circuit side of the RAM; and reading and comparison means, in the CPU, for reading and comparing data stored in the RAM from the port of the RAM on the CPU side of the RAM, and the rewritten data, to determine if operation of the port on the hardware circuit side of the RAM is correct.

6. A controlling apparatus for the examination of a multiport RAM as set forth in claim 5, wherein said RAM examination controller comprises:

an address counter for setting an address for the RAM; and a data latch circuit coupled with a data buffer circuit for writing the data in the RAM through the port on the hardware circuit side of the RAM after data is read from the port of the RAM on the hardware side of the RAM.

* * * * *

UNITED STATES PATENT AND TRADEMARK OFFICE
CERTIFICATE OF CORRECTION

PATENT NO.   : 5,812,559
DATED        : September 22, 1998
INVENTOR(S)  : Nakaide et al.

It is certified that error appears in the above-indentified patent and that said Letters Patent is hereby corrected as shown below:

Column 3, line 19, delete "memories" and insert --sides-- therefor

Column 3, line 40, delete "at the RAMs" and insert --of the RAMs-- therefor

Column 6, line 19, after "invention." start a new paragraph

Column 7, line 49, delete "signals" and insert --signal-- therefor

Signed and Sealed this

Twenty-sixth Day of October, 1999

Attest:

Q. TODD DICKINSON

*Attesting Officer*        *Acting Commissioner of Patents and Trademarks*